US008881967B2

United States Patent
Matsumoto et al.

(10) Patent No.: US 8,881,967 B2
(45) Date of Patent: Nov. 11, 2014

(54) APPARATUS FOR INTERCONNECTING CONNECTION PADS OF A HEAD-GIMBAL ASSEMBLY AND MANUFACTURING METHOD FOR THE HEAD-GIMBAL ASSEMBLY

(75) Inventors: Yuhsuke Matsumoto, Kanagawa (JP); Tatsumi Tsuchiya, Kanagawa (JP); Eiki Oosawa, Kanagawa (JP); Tatsushi Yoshida, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 578 days.

(21) Appl. No.: 12/576,715

(22) Filed: Oct. 9, 2009

(65) Prior Publication Data

US 2010/0089981 A1 Apr. 15, 2010

(30) Foreign Application Priority Data

Oct. 10, 2008 (JP) .................................. 2008-264624

(51) Int. Cl.
| | | |
|---|---|---|
| B23K 1/00 | (2006.01) | |
| B23K 26/14 | (2014.01) | |
| B23K 3/06 | (2006.01) | |
| B23K 1/005 | (2006.01) | |
| B23K 26/03 | (2006.01) | |
| H05K 3/34 | (2006.01) | |

(52) U.S. Cl.
CPC ............ *B23K 1/0016* (2013.01); *H05K 3/3442* (2013.01); *B23K 2201/42* (2013.01); *H05K 2203/107* (2013.01); *B23K 26/1476* (2013.01); *H05K 2203/0195* (2013.01); *H05K 2203/041* (2013.01); *H05K 3/3478* (2013.01); *B23K 3/0623* (2013.01); *B23K 1/0056* (2013.01); *H05K 2201/10727* (2013.01); *B23K 26/03* (2013.01); *H05K 3/3494* (2013.01)
USPC .................... 228/245; 228/241.5; 219/121.68

(58) Field of Classification Search
USPC ............... 228/245, 248.1, 241.5; 219/121.63, 219/121.68, 121.76, 121.84, 121.85, 219/121.65, 121.64, 121.6
See application file for complete search history.

(56) References Cited

U.S. PATENT DOCUMENTS

| | | | |
|---|---|---|---|
| 5,653,381 A | | 8/1997 | Azdasht |
| 5,828,031 A | * | 10/1998 | Pattanaik ................. 219/121.63 |
| 5,977,512 A | * | 11/1999 | Azdasht et al. .......... 219/121.63 |
| 6,543,677 B2 | * | 4/2003 | Pattanaik et al. ............. 228/246 |

(Continued)

FOREIGN PATENT DOCUMENTS

| | | |
|---|---|---|
| CN | 2006/10082084.3 | 3/2006 |
| CN | 2008/10085616.8 | 1/2008 |
| JP | 2006-305634 | 11/2006 |

*Primary Examiner* — Scott Kastler
*Assistant Examiner* — Michael Aboagye

(57) ABSTRACT

An apparatus for interconnecting two connection pads in a head-gimbal assembly. The apparatus includes a conveyer for conveying a metallic slug, and a nozzle for ejecting the metallic slug toward the two connection pads. The nozzle includes a receiving portion for receiving the metallic slug from the conveyer, and a straight guide disposed downstream of the receiving portion. The straight guide has a maximum inner diameter that is smaller than a minimum inner diameter of the receiving portion. The apparatus also includes a laser for applying a laser beam from an inlet side of the nozzle to the metallic slug as the metallic slug passes along a path that includes a first portion through said straight guide and a second portion between the straight guide and the two connection pads. The laser is configured to melt the metallic slug for attaching the metallic slug to the two connection pads.

11 Claims, 8 Drawing Sheets

(56) References Cited

U.S. PATENT DOCUMENTS

| | | | |
|---|---|---|---|
| 6,742,694 B2* | 6/2004 | Satoh et al. | 228/41 |
| 7,829,817 B2* | 11/2010 | Zakel et al. | 219/121.6 |
| 2004/0069758 A1 | 4/2004 | Azdasht et al. | |
| 2005/0195527 A1* | 9/2005 | Yamaguchi | 360/234.5 |
| 2006/0065641 A1* | 3/2006 | Shindo et al. | 219/121.63 |
| 2006/0219760 A1* | 10/2006 | Wagoh et al. | 228/248.1 |
| 2006/0237514 A1 | 10/2006 | Wagou et al. | |
| 2007/0228021 A1 | 10/2007 | Wagou et al. | |

* cited by examiner

APPARATUS FOR INTERCONNECTING CONNECTION PADS OF A HEAD-GIMBAL ASSEMBLY AND MANUFACTURING METHOD FOR THE HEAD-GIMBAL ASSEMBLY

CROSS-REFERENCE TO RELATED APPLICATION

This application claims priority from the Japanese Patent Application No. 2008-264624, filed Oct. 10, 2008, the disclosure of which is incorporated herein in its entirety by reference.

TECHNICAL FIELD

Embodiments of the present invention relate to an apparatus for interconnecting connection pads of a head-gimbal assembly (HGA) and a manufacturing method of a HGA.

BACKGROUND

Data-storage devices using various kinds of media, such as optical disks, magnetic-recording disks, magneto-optical disks, and similar disks for data-storage devices are known in the art. In particular, hard disk drives (HDDs) have been widely used as data-storage devices that have proven to be indispensable for contemporary computer systems. Moreover, HDDs have found widespread application to motion picture recording and reproducing apparatuses, car navigation systems, digital cameras, cellular phones, and similar devices, in addition to computers, due to their outstanding information-storage characteristics.

A HDD includes a head-slider for accessing a magnetic-recording disk and an actuator for supporting the head-slider and rotating the head-slider in proximity to the recording surface of the magnetic-recording disk. The actuator includes a suspension to which the head-slider is affixed. The lift generated by the airflow between the head-slider and the spinning magnetic-recording disk balances the force applied to the head-slider by the suspension to allow the head-slider to fly in proximity to the recording surface of the magnetic-recording disk.

Solder-ball bonding (SBB) is known in the art as a method for electrically interconnecting a slider with the transmission lines of the suspension. A conventional SBB method disposes solder balls between connection pads of a head-slider and connection pads of a suspension and performs a reflow process with a laser beam to electrically interconnect the connection pads of the head-slider and the connection pads of the suspension. The solder balls undergo a reflow process within an atmosphere of an inert gas such as nitrogen to prevent the solder surfaces from being oxidized.

To melt a solder ball disposed between two connection pads by a reflow process with a laser beam, the solder ball must be correctly disposed between the pads. However, a head-slider is a tiny component and further miniaturization of the head-slider is under development. Consequently, connection pads and solder balls disposed on the head-slider are becoming smaller so that disposing solder balls at the proper locations for soldering is becoming progressively more difficult. In addition, solder balls often roll away from the bonding location during the reflow process. Accordingly, numerous re-work attempts to reposition solder balls in SBB may cause a reduction in manufacturing efficiency.

SUMMARY

Embodiments of the present invention include an apparatus for interconnecting two connection pads in a head-gimbal assembly. The apparatus includes a conveyer for conveying a metallic slug, and a nozzle for ejecting the metallic slug toward the two connection pads. The nozzle includes a receiving portion for receiving the metallic slug from the conveyer, and a straight guide disposed downstream of the receiving portion. The straight guide has a maximum inner diameter such that the maximum inner diameter is smaller than a minimum inner diameter of the receiving portion. The apparatus also includes a laser for applying a laser beam from an inlet side of the nozzle to the metallic slug as the metallic slug passes along a path that includes a first portion through the straight guide and a second portion between the straight guide and the two connection pads. The laser is configured to melt the metallic slug for attaching the molten metallic slug to the two connection pads.

DESCRIPTION OF THE DRAWINGS

The accompanying drawings, which are incorporated in and form a part of this specification, illustrate embodiments of the invention and, together with the description, serve to explain the embodiments of the present invention.

Figure 1:
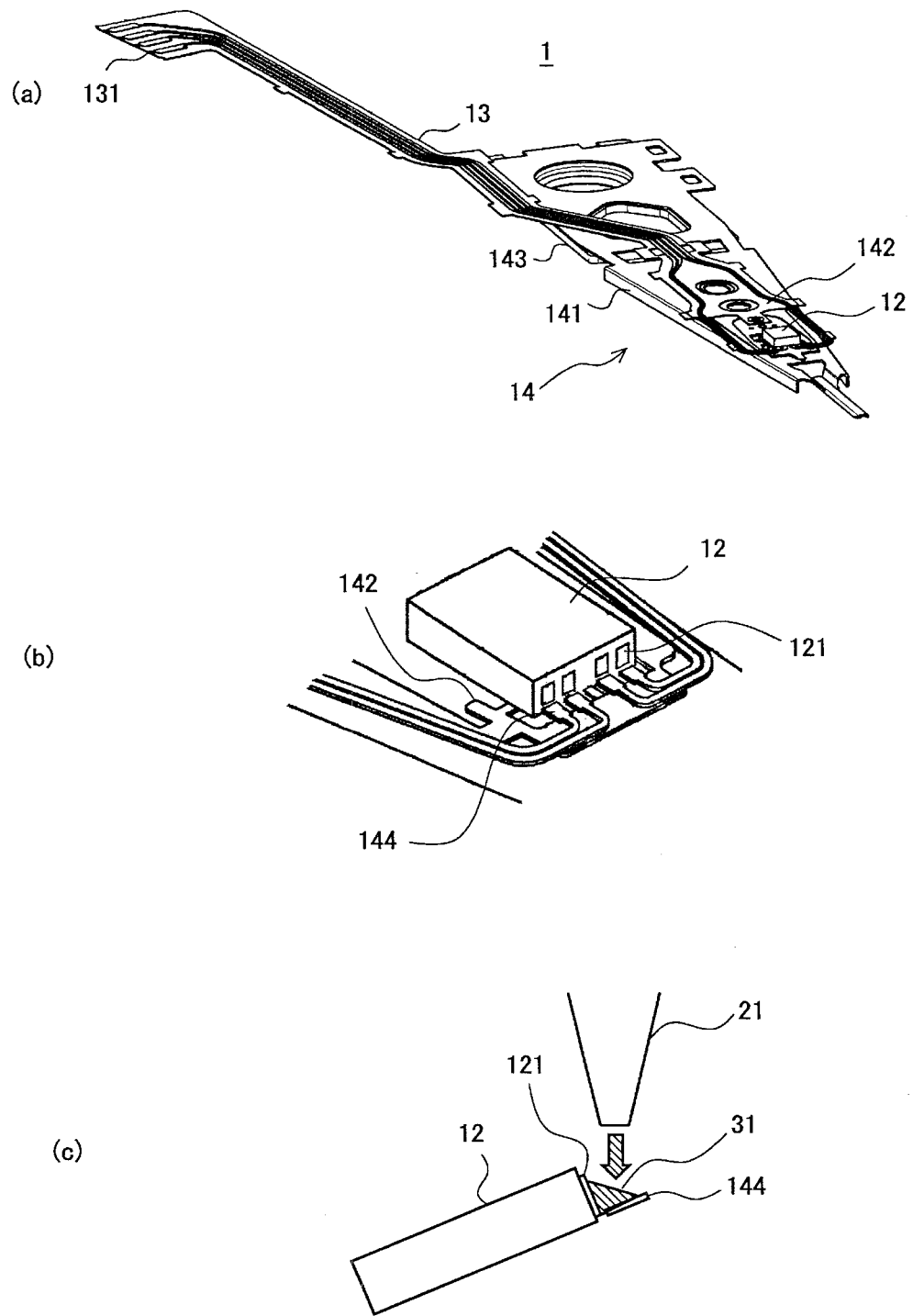
FIGS. 1(a), 1(b) and 1(c) are perspective views schematically depicting an example structure of a head-gimbal assembly (HGA), in accordance with an embodiment of the present invention.

The drawings referred to in this description should not be understood as being drawn to scale except if specifically noted.

DESCRIPTION OF EMBODIMENTS

Reference will now be made in detail to the alternative embodiments of the present invention. While the invention will be described in conjunction with the alternative embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention. Throughout the drawings, like components are denoted by like reference numerals, and repetitive descriptions are omitted for clarity of explanation if not necessary. Description of Embodiments of the Present Invention for an Apparatus for Interconnecting Connection Pads of a Head-Gimbal Assembly and a Manufacturing Method for the Head-Gimbal Assembly With relevance to embodiments of the present invention, a soldering apparatus is known in the art that melts solder balls with a laser beam before ejecting the solder balls between pads for soldering. Such a soldering apparatus may include a stopper which opens and closes an opening at a nozzle tip. A solder ball conveyed from a dispenser to the nozzle may be loaded on the closed stopper. Such a soldering apparatus may open the stopper to drop the solder ball. Coincidentally with the opening of the stopper, the apparatus may apply a laser beam to the solder ball through the opening at the nozzle tip to melt the solder ball in an atmosphere outside the nozzle. The molten solder ball adheres to connection pads of the head-slider and the suspension to interconnect the head-slider with the suspension.

With further relevance to embodiments of the present invention, according to a soldering method known in the art that utilizes the above-described soldering apparatus, solder balls are melted in an atmosphere outside the nozzle, so the solder balls are prevented from sticking to the inner wall of the nozzle, or the periphery of the opening. Such a soldering method provides a suction hole instead of the stopper in the proximity of the tip opening and sucks a solder ball at the suction hole to hold the solder ball.

With further relevance to embodiments of the present invention, the above-described soldering apparatus may hold solder balls at the opening by the stopper, or alternatively, utilize suction, to control the timing of application of a laser beam to the solder balls. However, a tiny driving mechanism such as a stopper may malfunction; and, an opening movement of the stopper may cause the direction of fall of the solder ball to be shifted from the vertical direction. The inventors have come to recognize and appreciate that the sticking of a solder ball to the suction hole, the reliability of suction of a solder ball, the stability of the fall of the solder ball, the predictability of the time at which the solder ball begins to fall caused by stopping the suction, and further, the timing control of application of the laser beam are issues that affect the above-described soldering apparatus and soldering method. To address these issues, as well as other issues not mentioned above, embodiments of the present invention are subsequently described herein.

In one embodiment of the present invention, to accurately attach molten solder to connection pads, the spacing between the nozzle's tip and the connection pads is made smaller. If a laser beam is applied after the solder ball has been ejected from the nozzle's orifice, the smaller spacing reduces the time for application of a laser beam to the solder ball so that the solder ball may not be adequately melted. Moreover, increasing the laser power may likely cause the connection pad to be damaged. In accordance with embodiments of the present invention, a laser beam is applied to a dropping solder ball without stopping the solder ball to melt the solder ball. To this end, in accordance with embodiments of the present invention, a manufacturing method includes accurately applying a laser beam to a dropping solder ball during a time needed to melt the solder ball.

An embodiment of the present invention includes an apparatus for interconnecting two connection pads in a head-gimbal assembly (HGA). The apparatus includes a conveyer for conveying a metallic slug, and a nozzle for ejecting the metallic slug toward the two connection pads that include a suspension connection pad and the head-slider connection pad. As used herein, the term or art, "metallic slug," includes a solder ball. The nozzle includes a receiving portion for receiving the metallic slug from the conveyer, and a straight guide which is disposed downstream of the receiving portion and has a maximum inner diameter smaller than the minimum inner diameter of the receiving portion. The apparatus also includes a laser for applying a laser beam from an inlet side of the nozzle to the metallic slug as the metallic slug passes along a path that includes a first portion through the straight guide and a second portion between the straight guide and the two connection pads. The laser is configured to melt the metallic slug for attaching the metallic slug to the two connection pads. Thus, the laser may apply a laser beam from the inlet side of the nozzle to the metallic slug while the metallic slug is passing through the straight guide and/or after the metallic slug has passed through the straight guide to melt the metallic slug for attaching the molten metallic slug to the two pads. Thus, in accordance with embodiments of the present invention, the straight guide makes movement of the metallic slug stable so that a laser beam can melt the metallic slug reliably.

In another embodiment of the present invention, the laser is configured to apply the laser beam to the metallic slug while the metallic slug is passing through the straight guide. Thus, in accordance with embodiments of the present invention, the metallic slug can be melted with more reliability and the nozzle tip can be brought closer to the connection pads.

In an embodiment of the present invention, the apparatus further includes an optical sensor for detecting the metallic slug; and, the laser is configured to apply a laser beam to the metallic slug in response to detection of the metallic slug by the optical sensor. Thus, in accordance with embodiments of the present invention, the timing of application of the laser beam can be accurately controlled. In another embodiment of the present invention, the optical sensor is configured to detect the metallic slug inside the nozzle. Thus, in accordance with embodiments of the present invention, even if the tip of the nozzle is close to the connection pad, adequate time for application the laser beam can be attained. In another embodiment of the present invention, the nozzle includes a flat surface in an area which is configured to receive light for detecting the metallic slug by the optical sensor. Thus, in accordance with embodiments of the present invention, the metallic slug can be detected more reliably.

In an embodiment of the present invention, the conveyer is configured to convey the metallic slug to the nozzle with gas flow, and the nozzle includes a gas release hole other than an orifice for ejection of the metallic slug in a side surface of the nozzle. In an embodiment of the present invention, the gas release hole is disposed upstream from an inlet of the straight guide. Thus, in accordance with embodiments of the present invention, the metallic slug can be conveyed to the straight guide smoothly.

In an embodiment of the present invention, the straight guide is formed at an end portion of the nozzle and an outlet of the straight guide includes the orifice of the nozzle. Thus, in accordance with embodiments of the present invention, the molten metallic slug can be attached to a selected position on the connection pad more accurately.

In an embodiment of the present invention, the laser is configured to start applying a laser beam after the metallic slug has entered the straight guide. Thus, in accordance with embodiments of the present invention, the metallic slug can be melted more reliably. In an embodiment of the present invention, the metallic slug includes a metal ball, which includes a solder ball, as is subsequently described herein; the cross-section of the straight guide is circular; and, the inner diameter of the straight guide is greater than or equal to a diameter of the metal ball. Thus, in accordance with embodiments of the present invention, a metallic slug before being melted can smoothly move within the straight guide. In an embodiment of the present invention, the laser is configured to provide a laser beam with a minimum diameter that is larger than the inner diameter of the straight guide. Thus, in accordance with embodiments of the present invention, the metallic slug is melted more reliably.

Another embodiment of the present invention includes a manufacturing method of a HGA. The manufacturing method includes conveying a metallic slug to a nozzle. The manufacturing method also includes sending the metallic slug to a straight guide through a receiving portion in the nozzle such that the straight guide has a maximum inner diameter smaller than a minimum inner diameter of the receiving portion. In addition, the manufacturing method includes applying a laser beam from an inlet side of the nozzle to the metallic slug as the metallic slug passes along a path that includes a first portion through the straight guide and a second portion between the straight guide and the two connection pads. Thus, in an embodiment of the present invention, the manufacturing method includes applying a laser beam from the inlet side of the nozzle to the metallic slug while the metallic slug is passing through the straight guide and/or after the metallic slug has passed through the straight guide and melts the metallic slug. The manufacturing method further includes attaching the molten metallic slug to the two connection pads and hardening the metallic slug on the two connection pads to interconnect the two connection pads of the HGA. Thus, in accordance with embodiments of the present invention, sending the metallic slug through the straight guide makes movement of the metallic slug stable so that a laser beam can melt the metallic slug reliably.

In accordance with embodiments of the present invention, productivity in manufacturing HGAs can be increased. In accordance with embodiments of the present invention, a disk drive includes a hard disk drive (HDD). One embodiment of the present invention includes a manufacturing method for interconnection of connection pads of a HGA using a metallic slug that includes a metal ball, which includes a solder ball, as is subsequently described herein. The material of the metal balls may be gold, solder, or similar materials suitable for electrically coupling the connection pads with one another. In accordance with embodiments of the present invention, interconnection using solder balls is subsequently described as an embodiment of the present invention, by way of example without limitation thereto, as other materials and shapes for the metallic slug are encompassed within the spirit and scope of embodiments of the present invention.

In accordance with embodiments of the present invention, the interconnection with solder balls is suitable for interconnection between connection pads of a head-slider and connection pads on a suspension portion of the HGA. In addition, in a HGA that includes a microactuator, the interconnection with solder balls is also suitable for interconnection between connection pads of a head-slider and connection pads of the microactuator, or between connection pads of a microactuator and connection pads of a suspension portion of the HGA, as such are also encompassed within the spirit and scope of embodiments of the present invention. In accordance with embodiments of the present invention, an apparatus and a manufacturing method for interconnecting connection pads of a head-slider and connection pads of a suspension portion of the HGA with solder balls are subsequently described herein in detail.

With reference now to FIGS. 1(a) and 1(b), in accordance with an embodiment of the present invention, a perspective view is shown of an example HGA 1 to be mounted in a HDD; and, in FIG. 1(b), an enlarged view is shown of the vicinity of the front end of a head-slider 12, where suspension connection pads 144 and head-slider connection pads 121 have not yet been interconnected. The HGA 1 includes a head-slider 12, traces 13 that serve as transmission lines, and a suspension 14. The head-slider 21 includes a slider and a magnetic-recording head. The magnetic-recording head includes a read element, which includes a magnetoresistive sensor, for reading data from a magnetic-recording disk (not shown), and a write element, which includes an electromagnetic inductive write poles, for writing data to the magnetic-recording disk. Alternatively, the magnetic-recording head may include either one of a read element, or a write element.

With further reference to FIGS. 1(a) and 1(b), in accordance with an embodiment of the present invention, the suspension 14 is formed by securing a gimbal 142 on the side of a load beam 141 where the head-slider 12 is supported, and securing a mounting plate 143 on a backside of the load beam 141. The load beam 141 functions as a spring for generating a specific load which balances the lift on the head-slider 12. The gimbal 142 supports the head-slider 12 so as not to interfere with a change in position of the head-slider 12. In addition, a gimbal tongue is formed on the gimbal 142. On the gimbal tongue, the head-slider 12 is bonded.

With further reference to FIGS. 1(a) and 1(b), in accordance with an embodiment of the present invention, traces 13 for electrically connecting the head-slider 12 and a preamplifier IC (not shown) are formed by disposing multiple leads that are separated form one another on insulating sheets. An end 131 of traces 13 is connected to a substrate where the preamplifier IC is placed. At the other end of traces 13 on the side of the head-slider 12, suspension connection pads 144 are disposed as shown in FIG. 1(b). As shown in the example of FIG. 1(b), four suspension connection pads 144 are provided, by way of example without limitation thereto, as more than four pads are within the spirit and scope of embodiments of the present invention. The same number of head-head-slider connection pads 121 as the suspension connection pads 144 are disposed at the front end of the head-slider 12.

With reference now to FIG. 1(c), in accordance with an embodiment of the present invention, a side view is shown of one of the suspension connection pads 144 and one of the head-slider connection pads 121 that are interconnected with solder 31. A suspension connection pad 144 and a head-slider connection pad 121 are disposed in close proximity to one another at a specific angle, which is approximately 90° in the present example. In one embodiment of the present invention, the soldering apparatus includes a nozzle 21, and solder ejected from the tip of the nozzle drops to between the suspension connection pad 144 and the head-slider connection pad 121 in the molten state to stick to the suspension connection pad 144 and the head-slider connection pad 121. Thus, in accordance with an embodiment of the present invention, the solder 31 interconnects the suspension connection pad 144 with the head-slider connection pad 121 electrically and physically. In contrast with some other techniques of interconnecting a suspension connection pad 144 and a head-slider connection pad 121 that disposes a solder ball between the two pads and then applies a laser beam to melt the solder, embodiments of the present invention can prevent an error in disposing a solder ball at the location of the suspension connection pad 144 and the head-slider connection pad 121, or alternatively, an error caused by rolling of the solder ball during application of the laser beam, so that productivity in manufacturing HGAs and in manufacturing HDDs employing HGAs fabricated utilizing embodiments of the present invention can be increased.

Embodiments of the present invention include a manufacturing method for fabricating a HDD that includes a manufacturing method for fabricating a HGA 1, which includes the operation of electrically and physically interconnecting the suspension connection pads 144 and the head-slider connection pads 121. The manufacturing method for fabricating a HDD includes fabricating the head-slider 12. In addition to the head-slider 12, the manufacturing method for fabricating a HDD includes fabricating a suspension 14. The manufacturing method for fabricating a HDD also includes a manufacturing method for fabricating the HGA 1 by bonding the head-slider 12 to the suspension 14. In addition, the manufacturing method for fabricating a HDD includes securing an arm and a VCM coil to the HGA 1 to fabricate a head stack assembly (HSA), which is an assembly of an actuator and a head-slider 12. The manufacturing method for fabricating the HDD includes mounting a spindle motor, a magnetic-recording disk, and other components onto a base, along with the fabricated HSA, and securing a top cover to the base. Moreover, the manufacturing method for fabricating a HDD includes writing servo data onto the magnetic-recording disk and providing a control circuit for accessing data written to, or read from, the magnetic-recording disk of the HDD. In accordance with embodiments of the present invention, the operations of interconnecting the suspension connection pads 144 and the head-slider connection pads 121 in manufacturing a HGA 1 is next described in detail.

Figure 2:
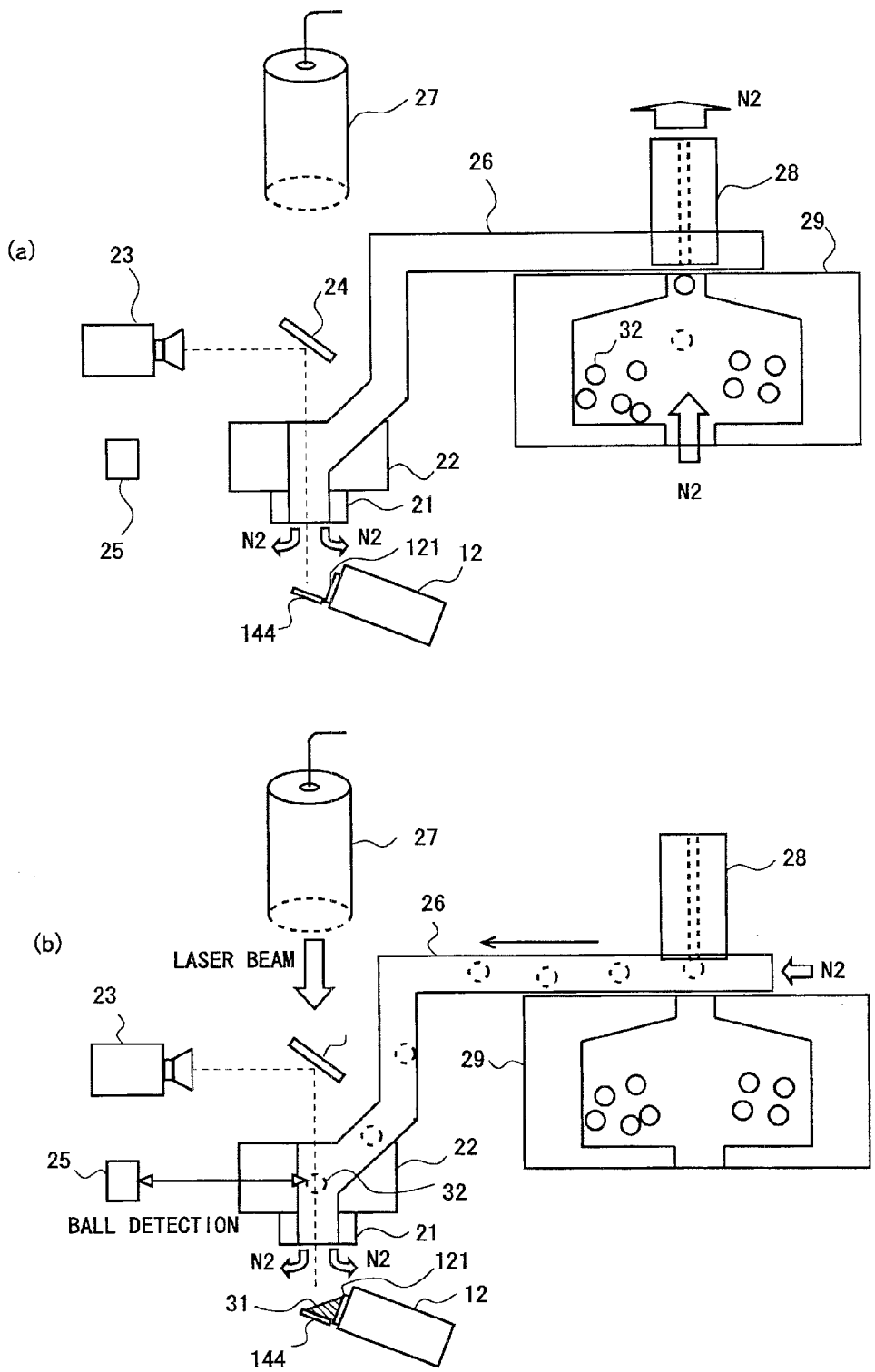
FIGS. 2(a) and 2(b) are diagrams schematically depicting an example configuration of a soldering apparatus for soldering head-slider connection pads and suspension connection pads, in accordance with an embodiment of the present invention.
Figure 3:
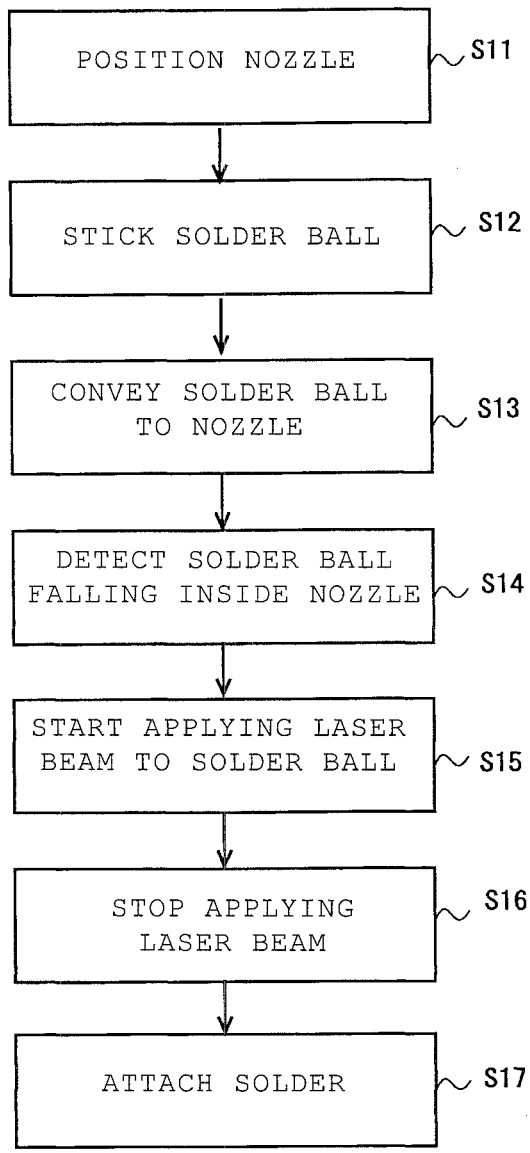
FIG. 3 is a flowchart illustrating an example solder-ball bonding (SBB) process, in accordance with an embodiment of the present invention.

With reference now to FIGS. 2(a), 2(b) and 3, in accordance with an embodiment of the present invention, drawings are shown that schematically depict a soldering apparatus and soldering operations for interconnecting the suspension connection pads 144 and the head-slider connection pads 121; and, in FIG. 3, a flowchart is shown that illustrates a portion of a process for soldering the suspension connection pads 144 to the head-slider connection pads 121. As shown in FIG. 2(a), first, at S11, a soldering apparatus depicted in FIGS. 2(a) and 2(b) positions a nozzle 21 in proximity to an interconnection point between a suspension connection pad 144 and a head-slider connection pad 121. The soldering apparatus depicted in FIGS. 2(a) and 2(b) includes a control device (not shown), which controls the components of the soldering apparatus to perform soldering. The soldering apparatus depicted in FIGS. 2(a) and 2(b) includes a camera 23; the soldering apparatus uses pictures taken through a half-silvered mirror 24 to move the nozzle 21 held by a nozzle holder 22 relative to the HGA 1, which is shown as yet unfinished in FIG. 2(a), positioning the nozzle in proximity to the connection pads, which include a suspension connection pad 144 and a head-slider connection pad 121. The tip of the nozzle 21 is positioned in proximity to the two pads and faces the two pads which include a suspension connection pad 144 and a head-slider connection pad 121. Depending on the structure of the apparatus, either the nozzle 21 and nozzle holder 22, or alternatively, the HGA 1 are moved in performing the above-described positioning operation.

Next, with further reference to FIGS. 2(a), 2(b) and 3, in accordance with an embodiment of the present invention, at S12, the soldering apparatus depicted in FIGS. 2(a) and 2(b) extracts a solder ball 32 with a sucker pad 28 from a solder ball dispenser 29 that stores the solder balls 32. The solder ball dispenser 29 admits inert gas, which, in one embodiment of the present invention, is mainly nitrogen gas, $N_2$, from the bottom of the solder ball dispenser 29 to levitate the solder balls 32. An opening is disposed at the top of the solder ball dispenser 29. Levitated solder balls 32 are ejected from the opening. An ejected solder ball 32 is stuck to the sucker pad 28 at the opening. If the sucker pad 28 takes hold of a solder ball 32, the sucker pad 28 moves upward and away from the opening; and, the solder ball 32 moves into a solder ball conveyer tube 26. As shown in FIG. 2(b), inside the solder ball conveyer tube 26, inert gas flows toward the nozzle holder 22. The sucker pad 28 releases the solder ball 32 within the solder ball conveyer tube 26. At S13, the solder ball 32 moves through the solder ball conveyer tube 26 with the inert gas flow and enters the nozzle 21 held by the nozzle holder 22.

With further reference to FIGS. 2(a), 2(b) and 3, in accordance with an embodiment of the present invention, the solder ball 32 falls inside the nozzle 21 by action of gravity assisted by the inert gas flow. At S14, the soldering apparatus depicted in FIGS. 2(a) and 2(b), which includes a detector 25, detects the solder ball 32 falling inside the nozzle 21. In one embodiment of the present invention, a detector 25 includes an optical sensor. The optical sensor can detect the solder ball 32 falling inside the nozzle 21 without stopping the solder ball 32. The nozzle 21 is made of a transparent material, which is transparent to the light detected by the optical sensor and enables the solder ball 32 to be detected by the optical sensor; and, in one embodiment of the present invention, a nozzle includes a ruby nozzle. Several types of optical sensors are known in the art: either a transmission type optical sensor for detecting interception of transmitted light, or alternatively, a reflection type optical sensor for detecting reflected light; either of which may be used. FIGS. 2(a) and 2(b) exemplify a reflection type optical sensor.

With further reference to FIGS. 2(a), 2(b) and 3, in accordance with an embodiment of the present invention, if the detector 25 detects a solder ball 32, at S15, a laser 27 emits a laser beam. The laser 27 emits a laser beam from up above the nozzle 21, which is the opposite side from where the head-slider 12 is disposed with respect to the nozzle 21; and, the laser beam is directed toward the tip of the nozzle through the nozzle 21. The dropping solder ball 32 receives the laser beam and becomes molten by absorbing energy from the laser beam. At S16, the laser 27 stops emission of the laser beam, and concomitantly, application of the laser beam to the solder ball, at a specific time. The molten solder continues to fall reaching the location between a suspension connection pad 144 and a head-slider connection pad 121 where, at S17, the molten solder attaches to the suspension connection pad 144 and the head-slider connection pad 121. The adhering solder is hardened to interconnect the suspension connection pad 144 with the head-slider connection pad 121.

Figure 4:
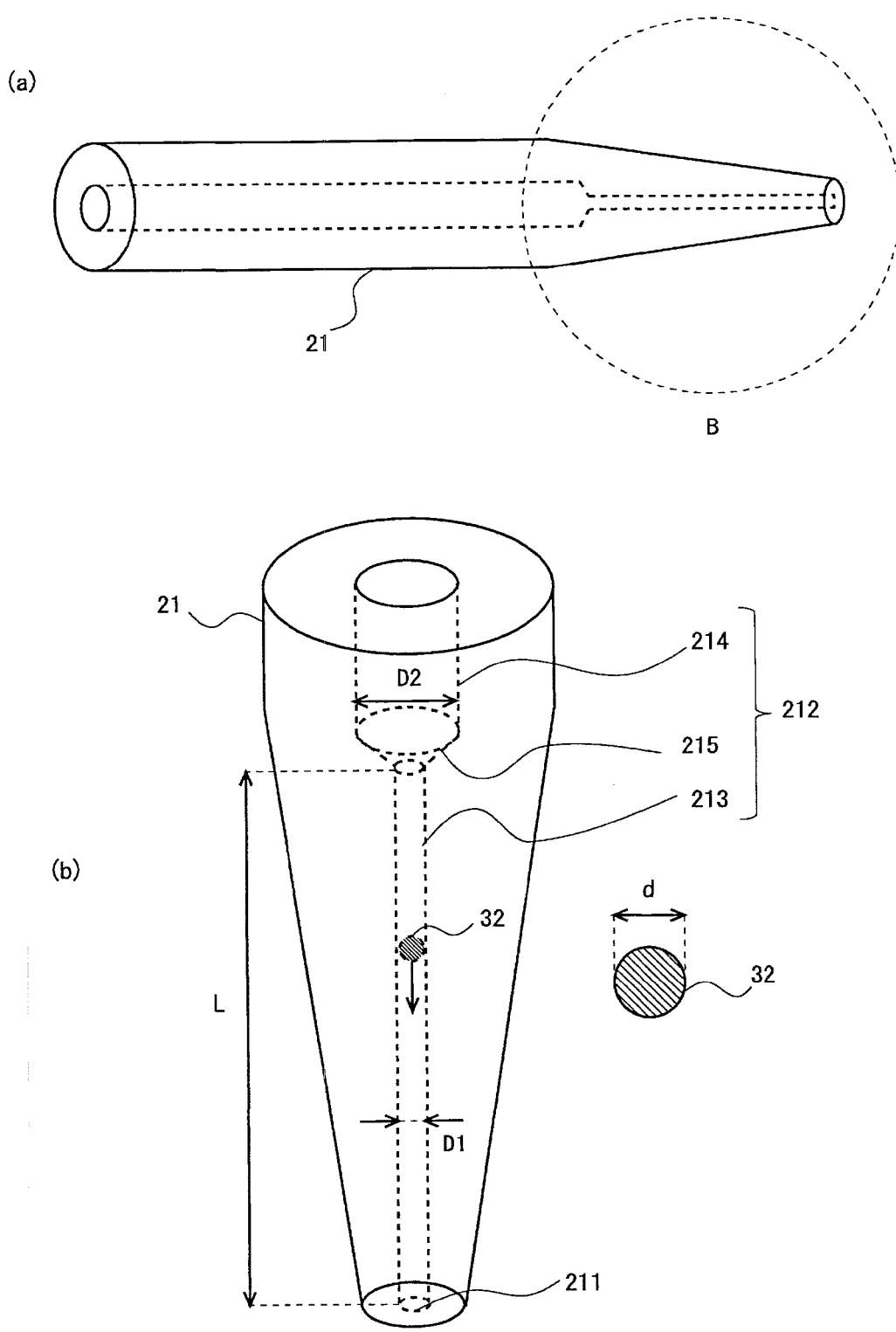
FIGS. 4(a) and 4(b) are drawings schematically depicting an example structure of a nozzle mounted on a soldering apparatus, in accordance with an embodiment of the present invention.

With reference now to FIGS. 4(a) and 4(b), in accordance with an embodiment of the present invention, perspective views are shown that depict the structure of the nozzle 21. In FIG. 4(b), an enlarged view of the portion enclosed by the dotted circle B in FIG. 4(a) is shown. The exterior appearance of the nozzle 21 is that of a substantially cylindrical body that gradually thins down toward a tip end throughout an end portion, which includes the tip. Namely, over the end portion of the nozzle 21, the outer diameter decreases from the inlet side toward the orifice 211. In this manner, the end portion of the nozzle 21 is tapered and the exterior is gradually thinned down. Thus, in accordance with an embodiment of the present invention, the orifice 211 at the tip of the nozzle 21 can be brought into proximity with the connection pads. In one embodiment of the present invention, the structure of the nozzle 21 includes a straight guide 213 having a length, L, such that the straight guide 213 is disposed in a channel 212 inside the nozzle 21. The straight guide 213 includes a straight channel from the inlet end to the outlet end of the straight guide 213. The cross-section of the inner wall of the straight guide 213 is circular and the inner diameter is uniform. The inner diameter, D1, of the straight guide 213 is greater than or equal to the diameter, d, of a solder ball 32, so the solder ball 32 can pass through the straight guide 213. On the other hand, the inner diameter, D1, is less than 2d, so a plurality of solder balls 32 cannot pass through the straight guide 213 side by side.

With further reference to FIGS. 4(a) and 4(b), in accordance with an embodiment of the present invention, the channel 212 includes a solder-ball receiving portion 214 at the inlet side of the straight guide 213. The receiving portion 214 includes a straight channel from the inlet to the outlet of the receiving portion 214. The cross-section of the inner wall of the receiving portion 214 is circular and the inner diameter, D2, is uniform. The inner diameter, D2, of the receiving portion 214 is larger than the inner diameter, D1, of the straight guide 213 to allow smooth loading of a solder ball 32 into the inside of the nozzle 21. Between the receiving portion 214 and the straight guide 213, a taper 215 is formed that connects the two channels of the receiving portion 214 and the straight guide 213, respectively, having different diameters, D2 and D1. Typically, a solder ball 32 having entered the solder ball receiving portion 214 repeatedly collides against the inner wall and falls toward the straight guide 213, and passes through the taper 215 to enter the straight guide 213. In the straight guide 213, the solder ball 32 exhibits a stable behavior, and correspondingly, a stable fall, unlike the behavior in the solder ball receiving portion 214. The solder ball 32 falls through the straight guide 213 and drops from the orifice 211 toward the connection pads, the suspension connection pad 144 and the head-slider connection pad 121. In the above-described embodiment of the present invention, to attach molten solder to connection pads stably at a desired speed, the tip of the nozzle 21 is directed vertically downward, by way of example without limitation thereto. Alternatively, in another embodiment of the present invention, a structure in which the nozzle 21 is inclined to the vertical direction and molten solder is blown at the connection pads by the inert gas flow from the nozzle 21 is also within the spirit and scope of embodiments of the present invention.

With further reference to FIGS. 4(a) and 4(b), in accordance with an embodiment of the present invention, the soldering apparatus depicted in FIGS. 2(a) and 2(b) applies a laser beam to the solder ball 32 moving from the inlet of the nozzle 21 toward the orifice 211. Hence, a suspension connection pad 144 and a head-slider connection pad 121 may be exposed to the laser beam. If the suspension connection pad 144 and the head-slider connection pad 121 are exposed to the laser beam for a long time, these connection pads, or the magnetic-recording head in the head-slider 12, may be damaged. In one embodiment of the present invention, the solder ball 32 is melted, the molten solder is attached to both the suspension connection pad 144 and the head-slider connection pad 121, and the solder is hardened on the connection pads. To this end, in accordance with embodiments of the present invention, the start time and the time period for application of the laser beam have been taken into consideration.

Figure 5:
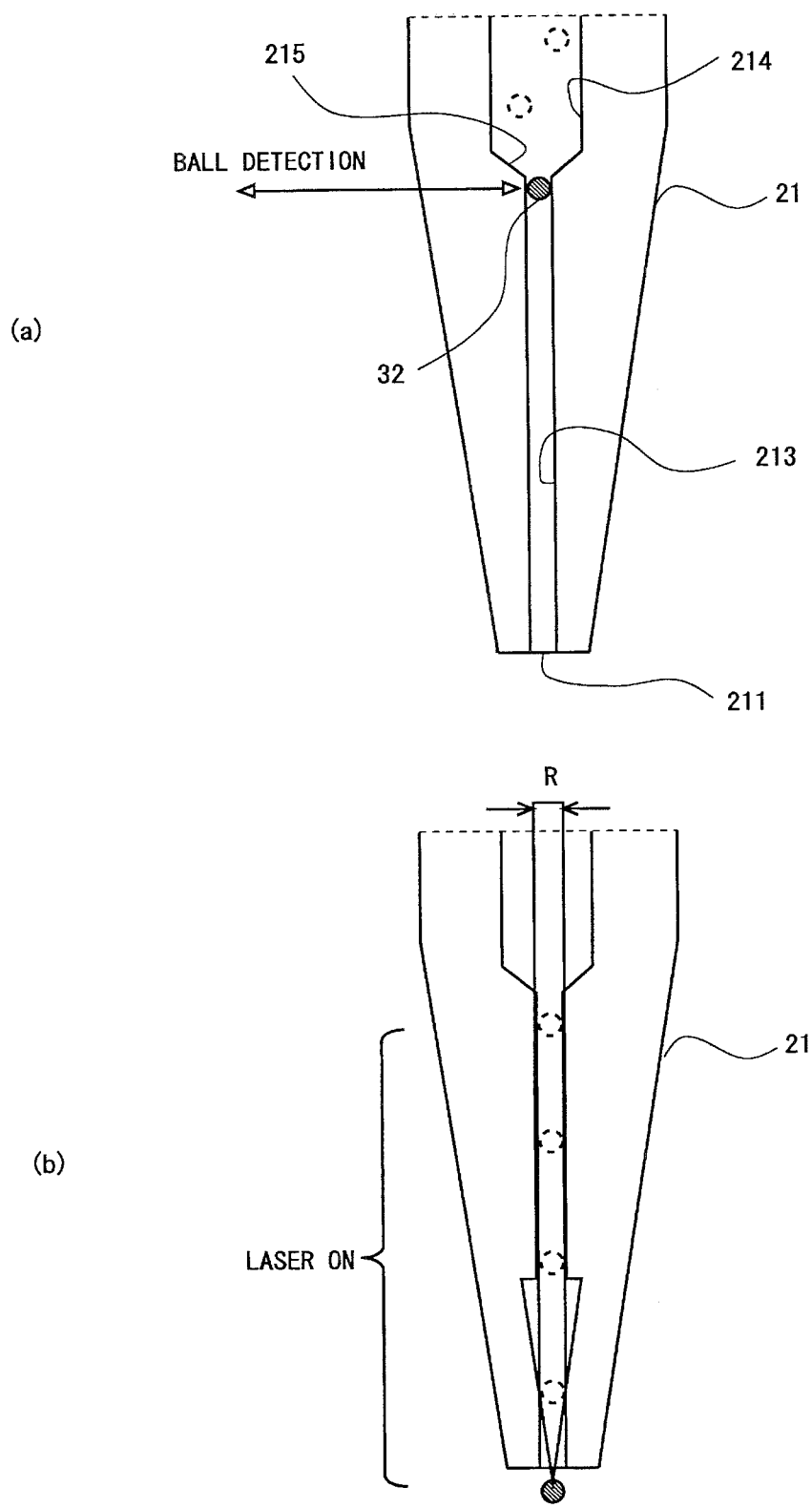
FIGS. 5(a) and 5(b) are drawings schematically illustrating an example process to melt a solder ball, passing through a nozzle, with a laser beam, in accordance with an embodiment of the present invention.

With reference now to FIGS. 5(a) and 5(b), in accordance with an embodiment of the present invention, drawings are shown that schematically illustrate a process to melt the solder ball 32 passing through the nozzle 21 with the laser beam. As shown in FIG. 5(a), in the soldering apparatus depicted in FIGS. 2(a) and 2(b), the detector 25 detects a solder ball 32 after the solder ball 32 has entered the straight guide 213. Since the behavior of the solder ball 32 is unstable within the solder ball receiving portion 214, the moment at which the solder ball 32 enters the straight guide 213 cannot be accurately gauged after detection by the detector 25. On the other hand, since the movement in the horizontal direction, which is the direction perpendicular to the direction of the fall, of the solder ball 32 is limited within the straight guide 213, the behavior of the solder ball 32 is stable within the straight guide 213. Hence, when the solder ball 32 is passing through the straight guide 213, or immediately after the solder ball 32 has passed the straight guide 213, a laser beam can reliably irradiate the solder ball 32. During passage of the solder ball 32 through the straight guide 213, the laser 27 starts applying the laser beam, once the detector 25 detects entrance of the solder ball 32 into the straight guide 213. In the example shown in FIG. 5(b), the laser 27 starts applying the laser beam when the solder ball 32 is falling through the straight guide 213; and, the laser 27 continues to apply the laser beam until the solder has passed through the straight guide 213 and left the orifice 211.

Figure 6:
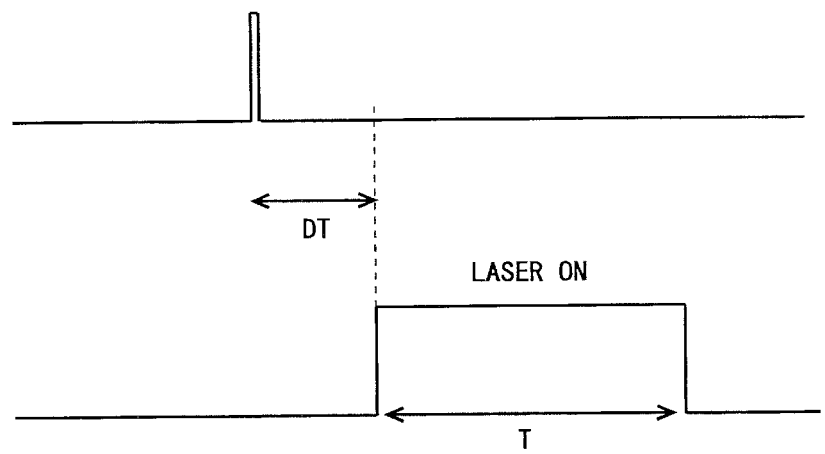
FIG. 6 is a timing chart schematically depicting an example relationship between solder-ball detection by a sensor of the soldering apparatus and the laser-beam application time period in melting the solder ball, in accordance with an embodiment of the present invention.

With reference now to FIG. 6, in accordance with an embodiment of the present invention, a timing chart is shown that illustrates the detection of a solder ball 32 by the detector 25 and the application period of the laser beam by laser 27. After a delay time, DT, has passed from the detection of the falling solder ball 32 by the detector 25, the laser 27 starts applying a laser beam. The laser 27 continues to apply the laser beam for a preset time period, T, and then stops applying the laser beam. In an embodiment of the present invention, for more accurate control of the application time of the laser beam, the delay time DT is kept short.

With further reference to FIG. 5(a), in accordance with an embodiment of the present invention, the detector 25 detects a solder ball 32 at the inlet of the straight guide 213. The detection position of the solder ball 32 is selected appropriately in consideration of: the delay time, DT, from detection to laser-beam application; the time period, T, while a laser beam is being applied; the length, L, of the straight guide 213; or the time period from detection of the solder ball 32 to departure of the solder ball 32 from the straight guide 213; and similar factors. If possible, the detector may detect the solder ball 32 immediately before the inlet of the straight guide 213. In accordance with an embodiment of the present invention, even if the solder ball 32 is detected at some arbitrary position, entrance of the solder ball 32 into the straight guide 213 involves accurate detection.

With further reference to FIGS. 4(b), 5(b) and 6, in accordance with an embodiment of the present invention, a laser beam is applied to the solder ball 32 while the solder ball 32 is falling through the straight guide 213. In another embodiment of the present invention, for the solder ball 32 to receive a laser beam for a sufficient time period, the laser beam starts to be applied when the solder ball 32 is falling through the straight guide 213. In an embodiment of the present invention, the spacing between the tip end of the nozzle 21 and the head-slider 12, and correspondingly, the connection pads, is short so that the molten solder may drop to the correct position. Otherwise, after the solder ball 32 has left the straight guide 213, the time period for application of the laser beam may not be adequate. While the solder ball 32 is within the straight guide 213, application of the laser beam to the suspension connection pad 144 and the head-slider connection pad 121 can be reduced. In an embodiment of the present invention, the laser beam application is stopped before the molten solder sticks to the suspension connection pad 144 and the head-slider connection pad 121. Thus, in accordance with embodiments of the present invention, solder can effectively stick to the suspension connection pad 144 and the head-slider connection pad 121 and be hardened on the suspension connection pad 144 and the head-slider connection pad 121. In addition, in an embodiment of the present invention, since the behavior of solder becomes less stable after leaving the straight guide 213, application of the laser beam may be stopped when the solder is within the straight guide 213. In this way, in an embodiment of the present invention, a laser beam is applied for an appropriate time while a solder ball 32 is within the straight guide 213. To this end, in an embodiment of the present invention, the length, L, of the straight guide 213 is longer than the distance between the tip end of the nozzle 21 and the corner between the suspension connection pad 144 and the head-slider connection pad 121, which allows solder to sufficiently melt and drop to the correct position.

With further reference to FIGS. 4(b), 5(a) and 5(b), in accordance with an embodiment of the present invention, for reliable laser beam irradiation of the solder ball 32, the spot diameter, R, of the laser beam is larger than the inner diameter, D1, of the straight guide 213. Thus, the inside of the straight guide 213 is filled with a laser beam so that the solder ball 32 falling through the straight guide 213 receives the laser beam. After the solder has been ejected from the straight guide 213, the solder can also receive a laser beam more reliably. In one embodiment of the present invention, for the above-described nozzle structure, the straight guide 213 is formed at the end portion, which is the tip, of the nozzle. Namely, the orifice 211 at the tip end of the nozzle includes the outlet of the straight guide 213 and the straight guide 213 extends upward from the nozzle's tip end surface. The straight guide 213 serves to guide the direction of movement, which is the direction of the fall, of a solder ball 32. The guide effect of the straight guide 213 acts on the solder ball 32 after the solder ball 32 has passed through the straight guide 213. Accordingly, in the front of, before the outlet side of, the straight guide 213, the nozzle 21 may have a channel with an enlarged inner diameter. However, in another embodiment of the present invention, to bring the tip of the nozzle as close as possible to the head-slider 12, and correspondingly, the connection pads, and accurately to apply a laser beam to the solder ball 32 while at the same time preventing the molten solder from sticking to the inner wall of the nozzle, the orifice 211, which is the outlet, of the straight guide 213, is disposed as close as possible to the tip end of the nozzle 21, namely, at a position closer to the suspension connection pads 144 and the head-slider connection pads 121.

With further reference to FIGS. 5(a) and 5(b), in accordance with an embodiment of the present invention, the wavelength or the energy, and correspondingly, the wattage, of the laser beam are selected appropriately for each soldering apparatus or each HGA. In a typical process, the wattage and the spot diameter of the laser beam are uniform. However, the wattage and the spot diameter of the laser beam may be changed while melting solder balls 32. For example, after a laser beam with high energy has been applied, the energy of the laser beam may be reduced; or after a laser beam with small spot diameter has been applied, the spot diameter may be increased. As described above, solder balls 32 are conveyed into the nozzle 21 with inert gas flow.

Figure 7:
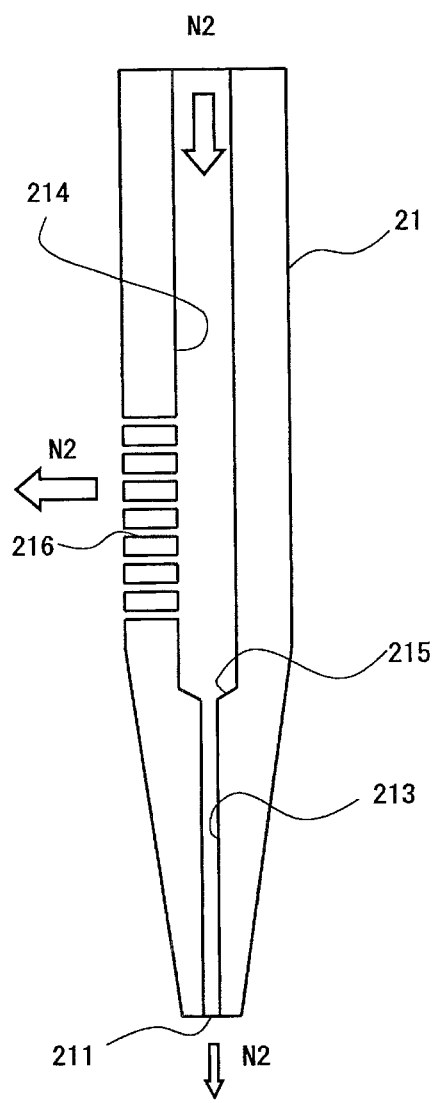
FIG. 7 is a drawing schematically depicting an alternative structure of a nozzle that may be mounted on the soldering apparatus, in accordance with an embodiment of the present invention.

With reference now to FIG. 7, in accordance with an embodiment of the present invention, the nozzle 21 includes a hole 216 to release the inert gas. When the performance of a nozzle having only an orifice 211 as an outlet of the inert gas was compared with a nozzle having a gas release hole 216, the solder balls 32 were able to enter the straight guide 213, and correspondingly, to fall, more smoothly in the nozzle having gas release hole 216. One explanation for this effect is as next described. With respect to the channel inside the nozzle, the inner diameter drastically decreases at the inlet of the straight guide 213, associated with the taper 215. Hence, the orifice 211 having a small area may cause turbulence of the gas flow before the straight guide 213 so that the solder balls 32 may not enter the straight guide 213 well. Thus, a gas release hole 216, other than the orifice 211, may suppress turbulence of gas flow allowing the solder balls 32 to be introduced into the straight guide 213 more smoothly. In an embodiment of the present invention, the gas release hole 216 is provided ahead of the inlet of the straight guide 213, which is upstream from the inlet of the straight guide 213, which allows much of the inert gas to escape through the gas release hole 216 before the inlet of the straight guide 213 so that the solder balls 32 can smoothly drop into the straight guide 213, mainly in consequence of the action of gravity. Moreover, the amount of gas escaping from the orifice 211 at the tip can be reduced, so the intensity of blowing of the molten solder to the connection pads is weakened, which reduces the possibility that the molten solder might spatter or spread to an undesired area.

With further reference to FIG. 7, in accordance with an embodiment of the present invention, to reduce the effect on the movement of the solder balls 32, the area of a gas release hole 216 is smaller than the cross-sectional area of the straight guide 213. Moreover, in an embodiment of the present invention, to provide sufficient gas release, the nozzle 21 has a plurality of gas release holes 216. Furthermore, in an embodiment of the present invention, so as not to disturb the detection of solder balls 32, the gas release hole 216 is formed in an area where the detection light from the detector 25 is not transmitted. As described above, in one embodiment of the present invention, the detector 25 is an optical sensor. In an embodiment of the present invention, since the optical sensor senses an object by receiving light, the nozzle 21 does not intercept the light to act on the solder balls 32.

Figure 8:
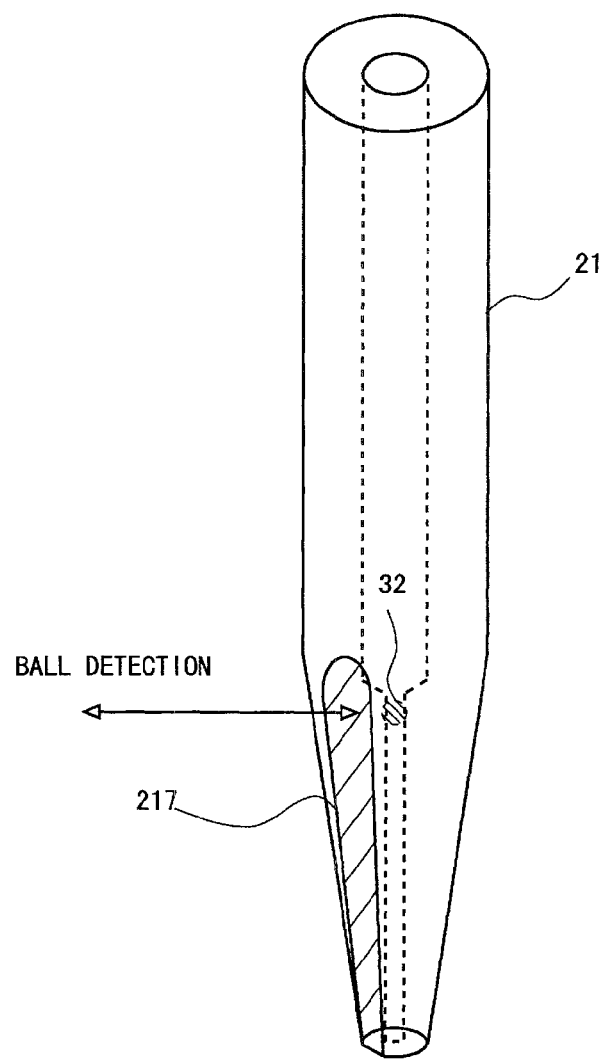
FIG. 8 is a drawing schematically depicting yet another alternative structure of a nozzle that may be mounted on the soldering apparatus, in accordance with an embodiment of the present invention.

With reference now to FIG. 8, in accordance with an embodiment of the present invention, an example using a reflection type optical sensor is shown. The nozzle 21 through which the detected light is transmitted includes a flat surface 217 on the outer surface of the nozzle 21. For example, the flat surface 217 can be formed by cutting out a portion of the cylindrical outer surface. At a position removed from the flat surface 217, an outer contour of a cross-section of the nozzle 21 has a form of a circle; but, at a position of the flat surface 217, an outer contour of a cross-section of the nozzle 21 has a form of a circle with a circular segment removed, similar to the form of a silicon wafer having an orientation flat. In use of a reflection type optical sensor, a flat surface 217 is located in the area facing the optical sensor. Light from the optical sensor enters the nozzle through the flat surface 217 and the light reflected by a solder ball 32 is received by the optical sensor through the flat surface 217. In use of a transmission type optical sensor, the flat surface 217 is placed so as to face the light source; and, the optical sensor is placed opposite the light source. The light from the source enters the nozzle through the flat surface 217 and the transmitted light, a portion of which has been intercepted a solder ball 32, is received by the optical sensor. Otherwise, two flat surfaces may be disposed so as to face the light source and the optical sensor respectively.

As set forth above, embodiments of the present invention have been described by way of examples; but, embodiments of the present invention are not limited to the above-described examples. A person skilled in the art can easily modify, add, and convert each element in the above-described examples within the spirit and scope of embodiments of the present invention. For example, in one embodiment of the present invention, nozzles with different structures have been described with reference to different drawings; but, these elements may be applied individually, or alternatively, in combination of the elements. For example, in another embodiment of the present invention, a structure of the nozzle includes both a gas release hole and a flat surface. In another example, embodiments of the present invention are not only useful in manufacturing a HGA of a HDD, but also may be applicable to a HGA of other types of disk drives. Embodiments of the present invention can be used not only in interconnection between a head-slider, a microactuator, and a suspension but also in interconnection of any components of a HGA. In other embodiments of the present invention, the number of interconnection points may vary depending on the design of the HGA. In another embodiment of the present invention, if oxidization of the metal used for interconnection, such as solder, or gold, is negligible, a gas different from an inert gas may be used in conveying the metallic slugs.

Furthermore, in other embodiments of the present invention, if conveyance of the metallic slugs is unimpeded, metallic slugs having shapes other than a sphere, such as the solder ball, may be melted to interconnect the connection pads. Similarly, in other embodiments of the present invention, the cross-section of the channel inside the nozzle may have shapes other than circular. In this case, in an embodiment of the present invention, the smallest inner diameter of the straight guide may be larger than the maximum diameter of the metallic slug and the spot diameter of the laser beam may be larger than the maximum inner diameter of the straight guide. In another embodiment of the present invention, the maximum inner diameter of the straight guide is smaller than the minimum inner diameter of the receiving portion at the upstream side.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus for interconnecting two connection pads in a head-gimbal assembly, comprising:
   a conveyer for conveying a metallic slug;
   a nozzle for ejecting said metallic slug toward said two connection pads, said nozzle comprising:
      a receiving portion for receiving said metallic slug from said conveyer;
      a gas release opening through a sidewall of said nozzle for enabling gas to escape said nozzle; and
      a straight guide, said straight guide disposed downstream of said receiving portion, and said straight guide having a maximum inner diameter such that said maximum inner diameter is smaller than a minimum inner diameter of said receiving portion, wherein without requiring an inner diameter of said straight guide to be greater than an outer diameter of said metal slug; and
   a laser for applying a laser beam from an inlet side of said nozzle to said metallic slug as said metallic slug passes along a path that comprises a first portion through said straight guide and a second portion between said straight guide and said two connection pads, said laser configured to melt said metallic slug for attaching said molten metallic slug to said two connection pads.

2. The apparatus of claim 1, wherein said laser is configured to apply said laser beam to said metallic slug while said metallic slug is passing through said straight guide.

3. The apparatus of claim 1, further comprising:
   an optical sensor for detecting said metallic slug;
   wherein said laser is configured to apply said laser beam to said metallic slug in response to detection of said metallic slug by said optical sensor.

4. The apparatus of claim 3, wherein said optical sensor is configured to detect said metallic slug inside said nozzle.

5. The apparatus of claim 4, wherein said nozzle further comprises:
   a flat surface in an area which is configured to receive light for detecting said metallic slug by said optical sensor.

6. The apparatus of claim 1, wherein said nozzle further comprises:
   a gas release hole, other than an orifice for ejection of said metallic slug, in a side surface; and wherein said conveyer is configured to convey said metallic slug to said nozzle with gas flow.

7. The apparatus of claim 6, wherein said gas release hole is disposed upstream from an inlet to said straight guide.

8. The apparatus of claim 1, wherein said straight guide is formed at an end portion of said nozzle and an outlet of said straight guide comprises an orifice of said nozzle.

9. The apparatus of claim 1, wherein said laser is configured to start applying said laser beam after said metallic slug has entered said straight guide.

10. The apparatus of claim 1, wherein said metallic slug comprises a metal ball, and a cross-section of said straight guide is circular and said inner diameter of said straight guide is greater than or equal to a diameter of said metallic slug.

11. The apparatus of claim 10, wherein said laser is configured to provide said laser beam with a minimum diameter that is larger than said inner diameter of said straight guide.

* * * * *